(12) United States Patent
Bahreyni

(10) Patent No.: US 10,084,001 B2
(45) Date of Patent: Sep. 25, 2018

(54) VECTOR LIGHT SENSOR AND ARRAY THEREOF

(71) Applicant: Simon Fraser University, Burnaby (CA)

(72) Inventor: Behraad Bahreyni, Port Moody (CA)

(73) Assignee: Simon Fraser University, Burnaby (CA)

(*) Notice: Subject to any disclaimer, the term of this patent is extended or adjusted under 35 U.S.C. 154(b) by 3 days.

(21) Appl. No.: 14/952,472

(22) Filed: Nov. 25, 2015

(65) Prior Publication Data

US 2016/0123801 A1  May 5, 2016

Related U.S. Application Data

(63) Continuation-in-part of application No. 14/925,858, filed on Oct. 28, 2015.

(60) Provisional application No. 62/073,377, filed on Oct. 31, 2014.

(51) Int. Cl.

| H01L 27/14 | (2006.01) |
|---|---|
| G01S 3/78 | (2006.01) |
| G01J 5/08 | (2006.01) |
| H01L 27/144 | (2006.01) |
| G01S 3/783 | (2006.01) |
| G01S 3/784 | (2006.01) |
| G01J 1/02 | (2006.01) |
| G01S 3/781 | (2006.01) |
| H01L 31/02 | (2006.01) |
| H01L 37/02 | (2006.01) |

(52) U.S. Cl.
CPC ........ *H01L 27/1446* (2013.01); *G01J 1/0266* (2013.01); *G01J 5/089* (2013.01); *G01S 3/781* (2013.01); *G01S 3/783* (2013.01); *G01S 3/784* (2013.01); *H01L 31/02024* (2013.01); *H01L 37/02* (2013.01)

(58) Field of Classification Search
CPC ........ G01J 1/0266; G01J 5/089; G01J 1/4228; G01S 3/783
See application file for complete search history.

(56) References Cited

U.S. PATENT DOCUMENTS

| 2,030,250 A | * | 2/1936 | Goodwin, Jr. ............ G01J 1/42 136/246 |
| 3,448,273 A | * | 6/1969 | Wong ....................... G01S 3/783 136/292 |
| 4,173,765 A | * | 11/1979 | Heald ................. H01L 27/14603 257/291 |

(Continued)

*Primary Examiner* — Shawn Decenzo
(74) *Attorney, Agent, or Firm* — Christensen O'Connor Johnson Kindness PLLC

(57) ABSTRACT

A vector light sensor (VLS) includes a substrate and a sensor structure. The substrate includes a major surface. The sensor structure includes a pyramid structure, light-sensitive areas, and electrical contacts. The pyramid structure forms at least a portion of a body of the sensor structure and has predefined angles between the major surface of the substrate and a plurality of sidewalls of the pyramid. The light-sensitive areas are formed on two or more of the plurality of sidewalls of the pyramid structure. The electrical contacts are electrically coupled to the light-sensitive areas. Information about the information about intensity and direction of an incident light beam can be extracted by comparing signals from two or more of the light-sensitive areas.

27 Claims, 13 Drawing Sheets

(56) References Cited

U.S. PATENT DOCUMENTS

| | | | | |
|---|---|---|---|---|
| 4,769,531 | A * | 9/1988 | Malek | G01S 3/783 |
| | | | | 126/574 |
| 6,185,950 | B1 * | 2/2001 | Baruschke | B60H 1/0075 |
| | | | | 236/91 C |
| 8,471,188 | B2 | 6/2013 | Schenk et al. | |
| 8,916,825 | B1 * | 12/2014 | Egerton | G01J 5/046 |
| | | | | 250/338.4 |
| 2008/0004758 | A1 * | 1/2008 | Lane | B64G 1/36 |
| | | | | 701/13 |
| 2009/0309032 | A1 * | 12/2009 | Ramsden | G01T 1/1644 |
| | | | | 250/370.1 |
| 2010/0283998 | A1 * | 11/2010 | Souchkov | G01J 1/02 |
| | | | | 356/141.2 |
| 2012/0161003 | A1 * | 6/2012 | Tsuchiya | G01J 5/0225 |
| | | | | 250/338.3 |
| 2012/0267603 | A1 | 10/2012 | Lee | |
| 2013/0006449 | A1 * | 1/2013 | Hindman | G01C 21/24 |
| | | | | 701/13 |
| 2014/0085265 | A1 | 3/2014 | Yin | |
| 2014/0203391 | A1 | 7/2014 | Daamen et al. | |
| 2015/0276913 | A1 * | 10/2015 | Mehrl | G01S 3/781 |
| | | | | 250/203.1 |

\* cited by examiner

VECTOR LIGHT SENSOR AND ARRAY THEREOF

CROSS-REFERENCE TO RELATED APPLICATION

This application is a continuation-in-part of U.S. patent application Ser. No. 14/925,858, filed Oct. 28, 2015, which claims the benefit of U.S. Provisional Application No. 62/073,377, filed Oct. 31, 2014, the disclosures of which are incorporated herein in their entirety.

FIELD OF THE INVENTION

The present disclosure relates to a light sensor that provides intensity and direction information for incident light as well as methods to build arrays thereof.

BACKGROUND

Numerous applications require knowledge of light intensity. One example is ambient light sensors that measure the amount of light near a portable device, such as a cellular phone, to adjust screen brightness. Another example is motion detection sensors that operate based on measurement of infrared light intensity from people. Image sensors are arrays of individual light sensors that, in some instances, are integrated on a chip. Optical components, such as lenses and mirrors, are often used to map the areal light intensity information onto the image sensors to provide an image of the field of view.

The light intensity may be measured through a variety of techniques. In some embodiments, the light-sensitive area is made from a semiconducting material of proper band-gap whose conductance changes in relation to the light intensity. In some embodiments, the light sensing area is made of a semiconducting material with suitable alternating doping so that a light-sensitive diode or transistor is formed. Some light sensors operate based on the changes in properties of nanoparticles or layers made from them, such as electrical conductance, to extract information about light intensity.

Typical light sensors have a planar structure and produce an electrical signal proportional to the intensity of an incident light beam. Many applications, however, require knowledge of the direction of the incident light beam as well. For example, room occupancy systems often need to monitor the location of infrared light sources (i.e., humans). Portable electronic devices can use directional light sensors to track users' gestures and movements. Two directional light sensors can be employed to estimate the distance to a light source using triangulation.

Extraction of direction information is typically based on a number of individual or integrated light sensors in combination with other discrete elements to provide direction information. In some embodiments, several discrete sensors each facing a different direction are used and the signals from those sensors are combined to extract the direction of light. In other cases, optical components are used to redirect light beams from different directions on one or more planar sensors. In U.S. Published Patent Application No. 2014/0085265 A1, methods are described to estimate the direction of light based on the measured intensity of light on a planar sensor which passes through beam steering elements. In U.S. Pat. No. 8,471,188 B2, a technique is described for estimation of the direction of light from modulated light source using rigidly-mounted sensors on a curved surface or by using a lens over a planar sensor surface. In U.S. Published Patent Application No. 2014/0203391 A1, methods are described to realize light sensors below fixed-angle channels for incident light. The direction of light is then estimated using the relative signal amplitudes from multiple sensors facing different directions.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments disclosed herein, a structure of a light sensor provides information about the intensity as well as the direction of the incident light beam. The sensor can be fabricated using integrated circuit microfabrication techniques. For this reason, it benefits from the scaling and batch fabrication advantages of microfabrication technologies.

A sensor that can provide information about the direction and intensity of the incident light beam is hereinafter referred to as a vector light sensor (VLS). Unlike planar light sensors, a VLS provides multiple sensing surfaces on a three-dimensional structure. In some embodiments, the three-dimensional structure is created through microfabrication techniques. In some embodiments, the three-dimensional structure can be in the shape of a pyramid with a square base and four triangular or trapezoidal sides. In some embodiments, a light-sensitive area is manufactured on each of these four sides and each sensing area provides light intensity information about the direction is facing. By comparing the signals from all sensing areas, the direction of the incident light beam can be calculated in addition to the light intensity.

In one embodiment, an arrangement of an individual VLS can be used for estimation of the range of a light source to the sensors. The estimation technique is based on simple triangulation using two sensors or modified techniques when one uses more than two sensors.

In other embodiments, linear or two-dimensional arrays of individual directional sensors are manufactured on a chip. Microfabrication technologies for creating such arrays are similar to those for creating a single sensor. In the case of an array, however, post-processing of signals from the sensors across the array can provide spatial information about the light sources in field of view.

DESCRIPTION OF THE DRAWINGS

In order to clearly illustrate the manner in which the above-mentioned sensor and systems based on this sensor operate, a detailed description of various embodiments is provided with reference to the appended drawings. These drawings are only sample embodiments and are not to be limiting the scope of invention.

DETAILED DESCRIPTION

Properties of light are measured in many applications, such as electronic systems, lighting control, and sun sensors. Typical existing sensors can provide information about only the intensity of an incident light beam. However, there are numerous applications where information about the direction of the light beam would also be desirable.

Figure 1:
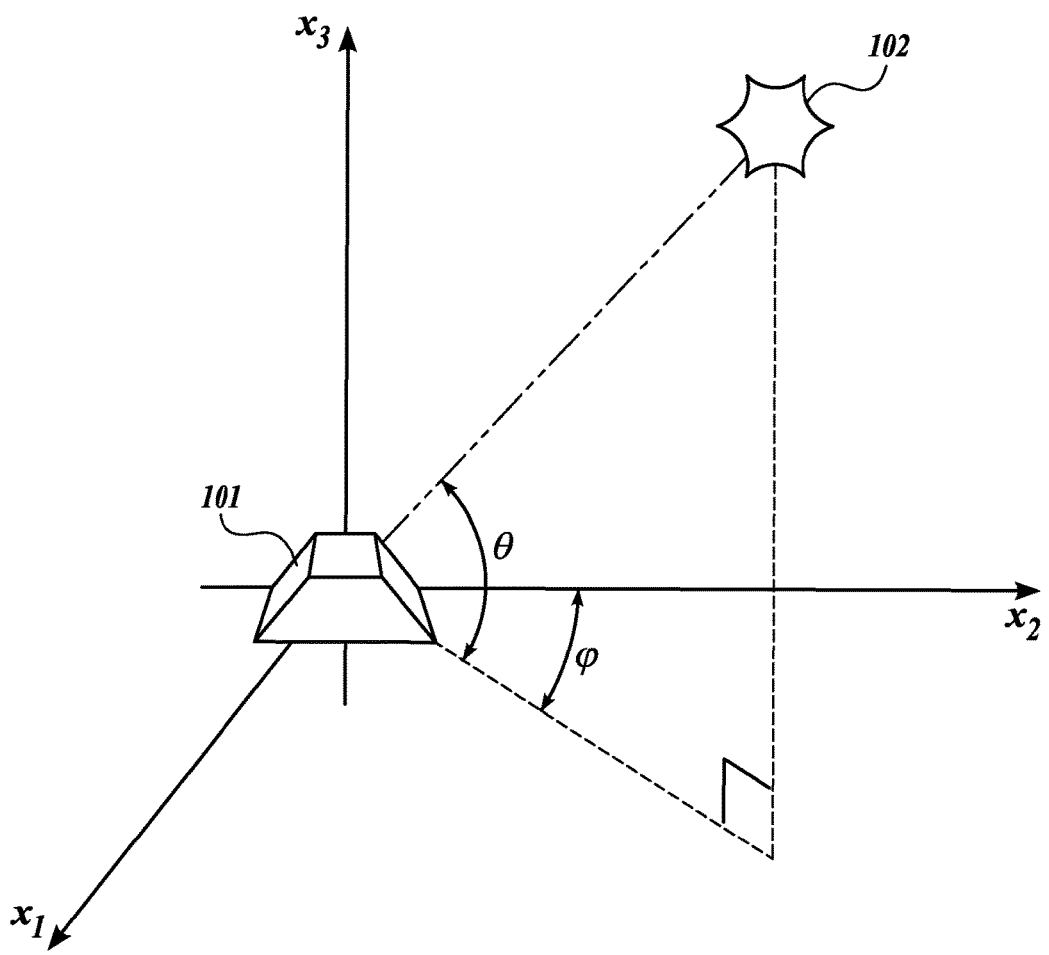
FIG. 1 demonstrates an example of the use of a VLS to determine the direction of light from a source.

The embodiments described herein are made by way of examples with reference to the accompanying drawings. An illustrative example of a VLS 101 is shown in FIG. 1. The VLS 101 is positioned at the origin of an arbitrary coordinate system with axes $x_1$, $x_2$, and $x_3$. The VLS 101 is configured to provide, not only the intensity of received light from a light source 102, but also angular information with regards to the direction of a light beam from the light source 102. In the particular example depicted in FIG. 1, the VLS 101 is configured to provide angles θ (i.e., the angle from the $x_2$ axis toward the $x_1$ axis in the $x_1$-$x_2$ plane) and φ (i.e., the angle from the $x_1$-$x_2$ plane toward the $x_3$ axis) in three-dimensional space. In some cases, angular information in a two-dimensional space may be desirable and a VLS may be configured to measure only one of the angles θ or φ. As is described in greater detail below, the ability to measure the direction of a light beam from the light source 102 (e.g., to measure angle θ and/or angle φ) is due to the three-dimensional structure of the VLS 101.

Figure 2:
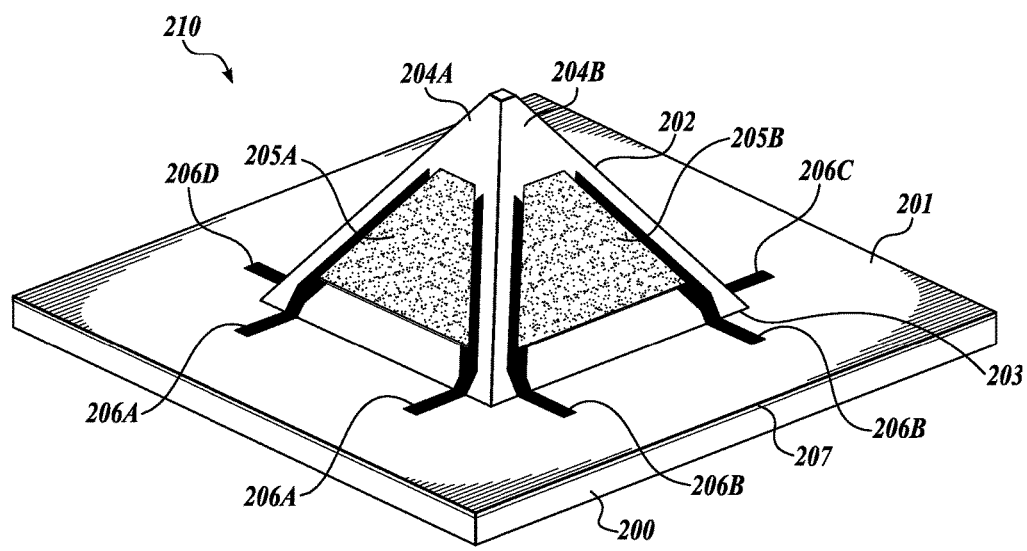
FIG. 2 illustrates an embodiment of a three-dimensional pyramidal structure of a VLS with four light-sensing areas around it.

FIG. 2 illustrates a close up view of an embodiment of a VLS 210. The VLS 210 is fabricated on a substrate 200. The substrate 200 has a major surface 201. In this embodiment, a main body 202 of the VLS 210 is a pyramid with four trapezoidal sides. The sides of the main body 202 include sides 204A and 204B, which are visible in FIG. 2, and two other sides, which are not visible in FIG. 2. The main body 202 of the VLS 210 also includes a base 203. In some embodiments, the base 203 is a polygon base, such as a square base (as shown in FIG. 2), a rectangular base, a triangular base, or another polygonal-shaped base.

Light-sensitive areas (LSAs) are formed on the sides of the VLS 210. In the depicted embodiment, LSAs 205A and 205B are visible on the sides 204A and 204B, respectively, of the VLS 210. In one embodiment, the VLS includes two more LSAs are formed on the two sides of the structure of the VLS 210 that are not visible in FIG. 2. In some embodiments, an LSA is configured to produce an electrical signal proportional to the intensity of the incident light on that LSA. For example, in some embodiments, each of the LSAs 205A and 205B is configured to produce an electrical signal proportional to the intensity of the incident light on the respective LSAs 205A and 205B.

In some embodiments, electrical contacts are used to convey resultant signals produced by LSAs. In some embodiment shown in FIG. 2, electrical contacts 206A-D are located on the main body 202 of the VLS 210 and the major surface 201 of the substrate 200. The positioning of the electrical contacts may depend on the employed light sensing mechanism, the size of the main body 202 of the VLS 210, the size of the LSAs 205A and 205B, or any other factor. In some embodiments, the electrical contacts 206A-D are formed on the main body 202 of the VLS 210 and/or the major surface 201 of the substrate 200 by depositing the electrical contacts 206A-D, bonding the electrical contacts 206A-D, electroplating the electrical contacts 206A-D, or forming the electrical contacts 206A-D in any other way. In other embodiments, the electrical contacts 206A-D are made from a metal material (e.g., copper, gold, etc.), conductive inks, conductive nanocomposites, conductive polymers, or any other conductive material.

In the depicted embodiment, the each of the electrical contacts 206A and 206B are pairs of electrical contacts placed at the edges of LSAs 205A and 205B, respectively. The electrical contacts 206A and 206B are usable to measure the change in the electrical properties of the LSAs 205A and 205B. In one example, the change in the electrical properties of the LSAs 205A and 205B are proportional to the incident light received by the LSAs 205A and 205B. In this example, the combinations of LSA 205A and electrical contacts 206A and LSA 205B and electrical contacts 206B form a light sensor providing light intensity information within the field of view of that sensor. The combination of one light-sensitive area and its electrical contacts is hereinafter referred to as a scalar light sensing element (SLSE). In the depicted embodiment, portion of each of the electrical contacts 206C and 206D are visible. These electrical contacts 206C and 206D are configured to be placed at the edges of LSAs on surfaces of the main body 202 that are not visible in FIG. 2.

The VLS 210 has a four-sided pyramidal structure with a square base. While VLS 210 and other illustrated embodiments herein depict four-sided pyramidal structures, it will be appreciated that any pyramidal structure is contemplated. For example, pyramids having a base with three, four, or more sides can be fabricated. Any order of polygonal base can be used. In some embodiments, the polygon base is a regular polygon with sides of substantially equal lengths (e.g., an equilateral triangle, a square, etc.). In other embodiments, the polygon base is a non-regular polygon having at least two sides that are not substantially the same size (e.g., a non-equilateral triangle, a non-square rectangle, etc.). Further, the pyramidal structure has sides that come to a point at the top in certain embodiments. However, in other embodiments, the pyramid has a flat top, such as the pyramid illustrated in FIG. 8B. In some embodiments, when the pyramid has a flat top, the flat top is parallel to the major surface of the substrate.

In some embodiments, is the substrate 200 includes a dielectric layer 207 that forms the major surface underneath the SLSEs (e.g., the combination of LSA 205A and electrical contacts 206A, the combination of LSA 205B and electrical contacts 206B, etc.) across the substrate 200. This dielectric layer 207 provides electrical isolation between different LSAs (e.g., LSA 205A and LSA 205B) and their electrical contacts (e.g., electrical contacts 206A and electrical contacts 206B). In some embodiments, the material of the dielectric material 207 includes one or more of silicon dioxide and silicon nitride.

Light intensity can be measured using a variety of mechanisms. Photoconductive materials may be used to provide information about the intensity of incident light. A signal from a light sensor with photoconductive materials represents a change in conductivity of the material as a function of light intensity received by the light sensor. In pyroelectric materials, an electrical charge is produced when the material is exposed to light (e.g., infrared light). Semiconductor p-n junctions are boundaries or interfaces between two types of semiconductor material (e.g., between p-type semiconductor material and n-type semiconductor material). In some embodiments, semiconductor p-n junctions are employed to fabricate light sensors in image sensors for cameras or optical communications. Nanoparticles are particles having a size typically in the range of 1 to 100 nm. Certain nanoparticles, including carbon nanotubes, may also be used for the detection of light at specific wavelengths or within specific wavelength ranges. Quantum dots are mostly spherical semiconductor crystals, small enough to quantum confine the free charge carriers of the semiconductor inside it. It may be desired to use quantum dots for the detection of incident light. The LSAs 205A and 205B in FIG. 2, and any other of the LSAs described herein, can be fabricated based on the aforementioned techniques or other light sensing methods.

In some embodiments, LSAs include a light sensitive layer, such as a layer of one of the materials mentioned in the preceding paragraph. In some embodiments, electrical contacts are made to the light sensitive layer through one electrode underneath the light sensitive layer and one electrode above the light sensitive layer. In such an arrangement, the incident light needs to travel through the top electrode and, therefore, the top electrode can be transparent to a particular wavelength or range of wavelengths of interest to avoid reduction in efficiency. Materials that can be used for such electrodes, including any contacts and traces, include various metals such as aluminum and gold, metal oxides such as titanium oxide, doped silicon or polysilicon. Conductive contacts and traces may also be formed from conductive inks, nanocomposites, or polymers.

Figure 3A:
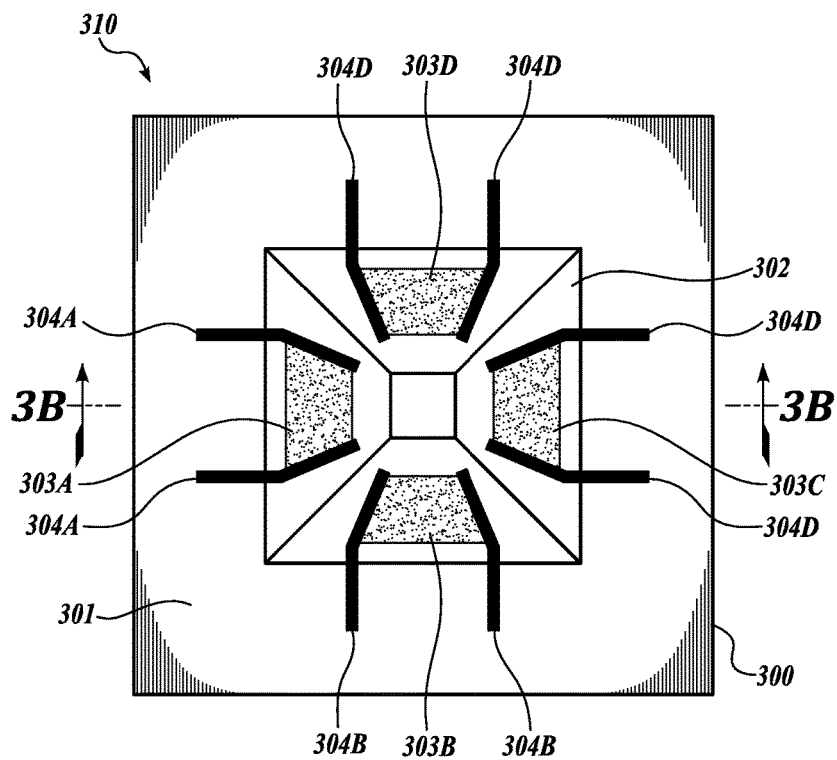
FIGS. 3A and 3B illustrate top and cross-sectional views, respectively, of an embodiment of a VLS.
Figure 3B:
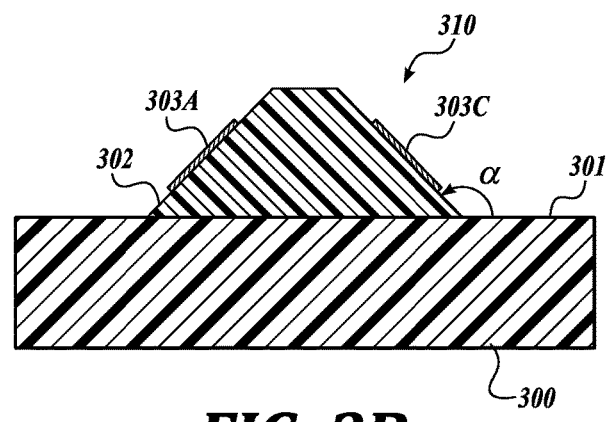

FIGS. 3A and 3B depict a top-view and a cross-sectional view, respectively, of a four-sided VLS 310, similar to the one shown in FIG. 2. The VLS 310 includes a substrate 300 with a major surface 301, a four-sided, pyramidal main body 302, LSAs 303A-D on sides of the pyramidal main body 302, and electrical contacts 304A-D corresponding to the LSAs 303A-D. As shown in FIG. 3B, an angle α is the angle between the sides of the main body 302 and the major surface 301 of the substrate 302. In a typical VLS design, angle α is in the range of 90° to 180°. For the exemplary device shown in FIGS. 3A and 3B, where the base of the pyramidal main body 302 is a regular polygon, each side of the pyramidal main body 302 is at the same angle with respect to the major surface 301 of the substrate 300. Thus, the LSAs 303A-D are all at the same angle with respect to the major surface 301 of the surface 300. In practical implementation, it may be simpler to maintain the same angle between all sides of the main body and the substrate. However, it is technically possible to realize different angles.

Figure 4:
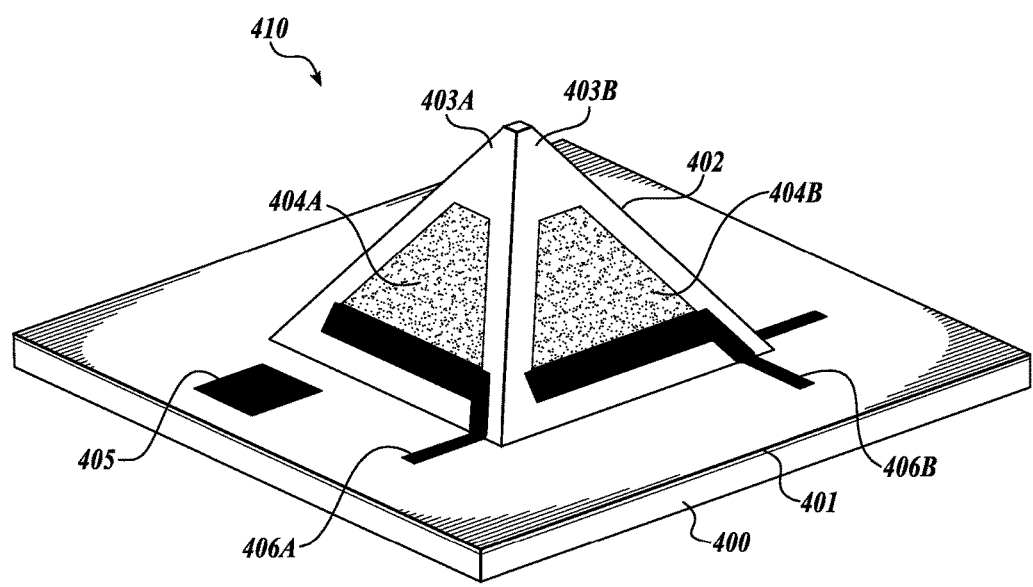
FIG. 4 shows an embodiment of a VLS where semiconductor pn junctions are used as photo-sensitive areas.

FIG. 4 depicts an embodiment of a four-sided VLS 410. The VLS 410 includes a substrate 400 with a major surface 401, a four-sided, pyramidal main body 402 including sides 403A-B, LSAs 404A-B on sides 403A-B of the pyramidal main body 402, and electrical contacts 404A-B corresponding to the LSAs 403A-B.

In the embodiment shown in FIG. 4, the LSAs 404A and 404B are made of semiconductor p-n junctions. The main body 402 is located on the substrate 400 with a major surface 401. In this embodiment, the sides 403A and 403B are fabricated from semiconductor layer, such as a crystalline, poly-crystalline, or amorphous semiconductor layer. A signal is generated by a light sensitive layer of each of the LSAs 404A-B and read through a pair of electrical contacts electrically coupled to each sensitive area of the LSAs 404A-B. In some embodiments, it is possible to share electrical contacts between sensitive areas facing different directions and even multiple LSAs and/or multiple VLSs that are fabricated on a single chip. Electrical routing is then simplified to having one contact to one side of the p-n junction on each sensitive area (e.g., contacts 406A and 406B on LSAs 404A-B) and the common contact 405 to the semiconductor layer 401 which forms the other side of the p-n junction. In other embodiments, the VLS 410 includes LSAs and corresponding electrical contacts on the sides of the pyramidal main body 402 that are not visible in FIG. 4.

Figure 5:
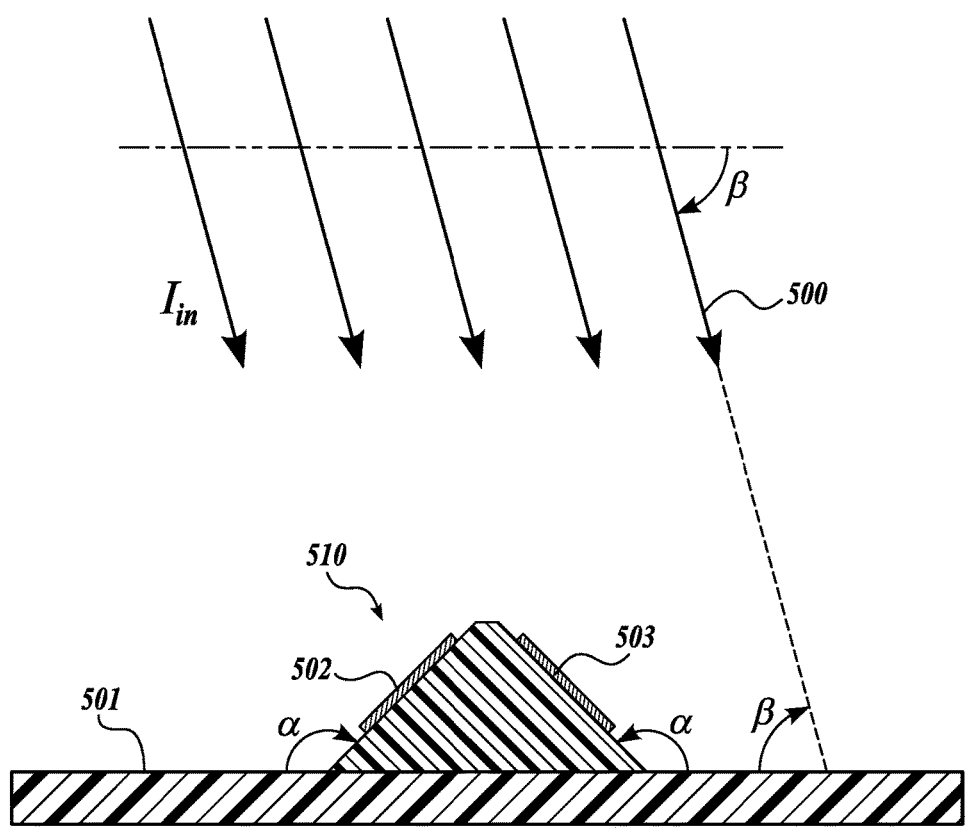
FIG. 5 demonstrates an example of the use of a VLS to determine the direction of a light beam in a plane.

FIG. 5 depicts a cross-sectional view of a VLS 510 and an example, in a two-dimensional space, of how the VLS 510 may be used to determine the direction of an incident beam of light 500 that impedes on a major plane 501 of the VLS 510 at angle β. The VLS 510 includes SLSEs 502 and 503 located on sides of a pyramidal main body. While different sensing areas can be fabricated with different sensitive areas and different angles with respect to the major plane 501, maintaining the same sensitive area and angle for all SLSEs may result in symmetry and simplified signal processing.

As shown in FIG. 5, the angle between each of the SLSEs 502 and 503 and the major plane 501 of the VLS 510 is α. The intensity of light, $I_{in}$, and the angle β of the incident beam of light 500 can be determined by solving the following equations:

$$I_l = A_S I_{in} \sin(\alpha - \beta) \quad (1)$$

$$I_r = -A_S I_{in} \sin(\alpha + \beta) \quad (2)$$

where $A_S$ is the effective sensing area of each SLSE, $I_l$ is the intensity of incident light measured by the left SLSE 502, and $I_r$ is the intensity of incident light measured by the right SLSE 503, and the angle α and area $A_S$ are known.

Figure 6:
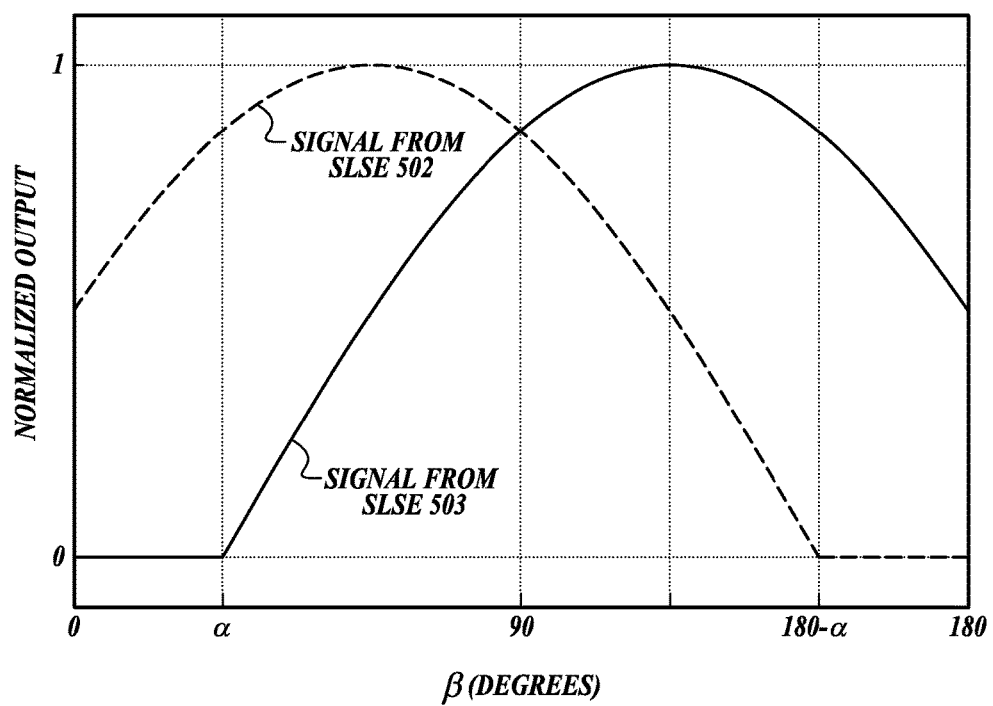
FIG. 6 depicts an example of a comparison of the light intensity as received by the two opposing light sensitive areas of a VLS.

FIG. 6 shows the normalized amount of light received by SLSEs 502 and 503 as the light source moves parallel to the plane of VLS 501 (i.e., β changes from 0° to) 180°. This figure illustrates the limited field of view of each SLSE. The VLS can only detect angles β when the incident light impedes on both SLSEs 502 and 503, limiting the viewing angle of the VLS to 180°−α<β<α.

Figure 7:
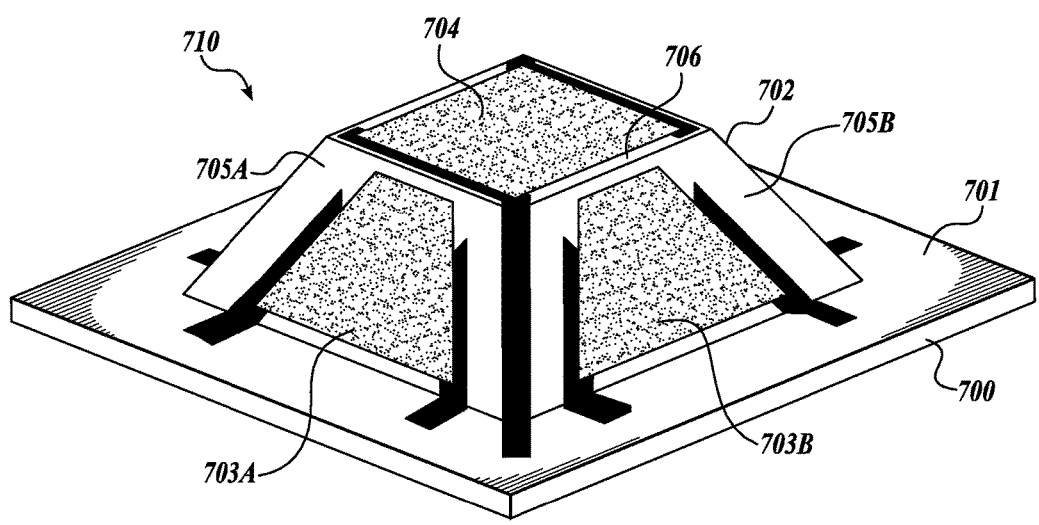
FIG. 7 illustrates an embodiment of a VLS with four sensitive surfaces around it and a fifth sensitive area on its top surface.

In some embodiments, the top surface of the VLS may be used for an additional SLSE. FIG. 7 illustrates an example of such a VLS 702 with a square base, four trapezoidal sides, and a flat surface on the top that is parallel to the major surface 701 of the substrate 700. This VLS also has SLSEs on its sides (e.g., SLSEs 703A and 703B on the sides 705A and 705B that are visible in this figure). The main difference between the VLS in FIG. 7 and FIG. 2 is the addition of a fifth SLSE 704 on the top surface of the VLS. Note that it is possible to use an SLSE that is fabricated on the principal plane of the sensor 201 or 701, rather than the top surface of the VLS, to achieve the same result.

Figure 8A:
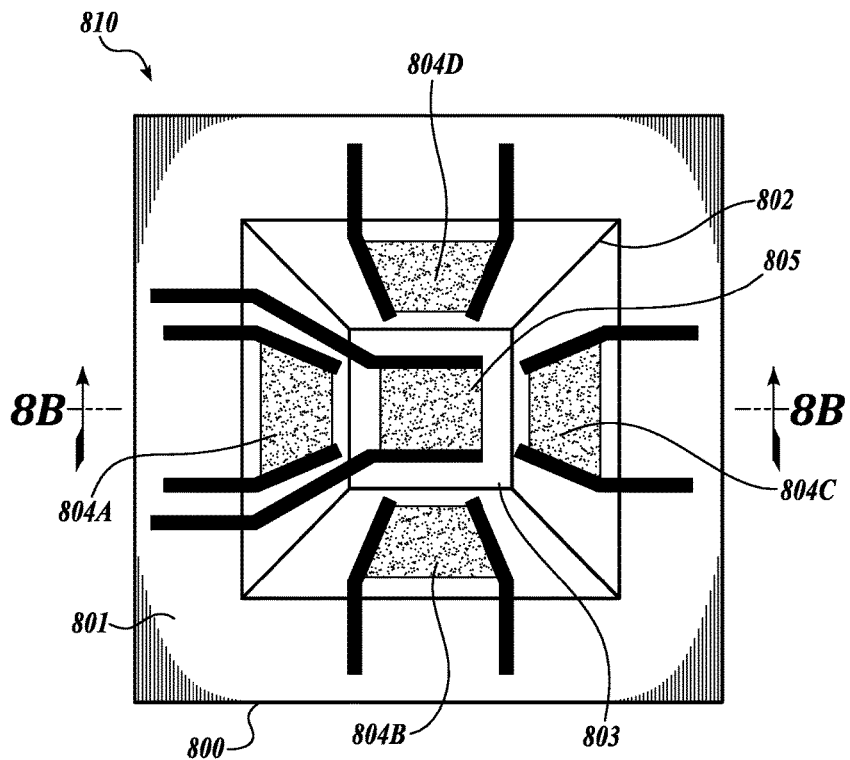
FIGS. 8A and 8B illustrate top and cross-sectional views, respectively, of an embodiment of a VLS, similar to the VLS depicted in FIG. 7.
Figure 8B:
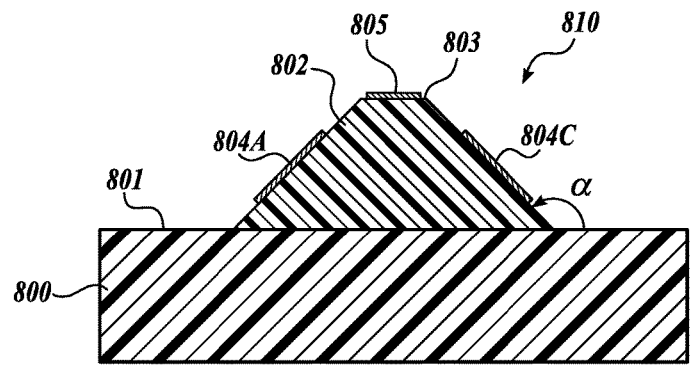

FIGS. 8A and 8B show a top-view (FIG. 8A) and a cross-sectional view (FIG. 8B; through line A-A' of FIG. 8A) of such an embodiment with a square base, respectively. A flat surface 803 is created on top of the VLS structure 802 that is parallel to the VLS plane 801. SLSE 805 is then realized on this surface. The SLSEs 804A, 804B, 804C, and 804D can be similar in terms of sensitive area and their respective angles with the major surface of the substrate 801. The intensity of light impeding on SLSEs 804A and 804C can still be found from equations (1) and (2). The intensity of light impeding on the SLSE 805 on top of the VLS is found from:

$$I_t = A_{St} I_{in} \sin \beta \tag{3}$$

where $A_{St}$ is the area of SLSE 805.

Figure 9:
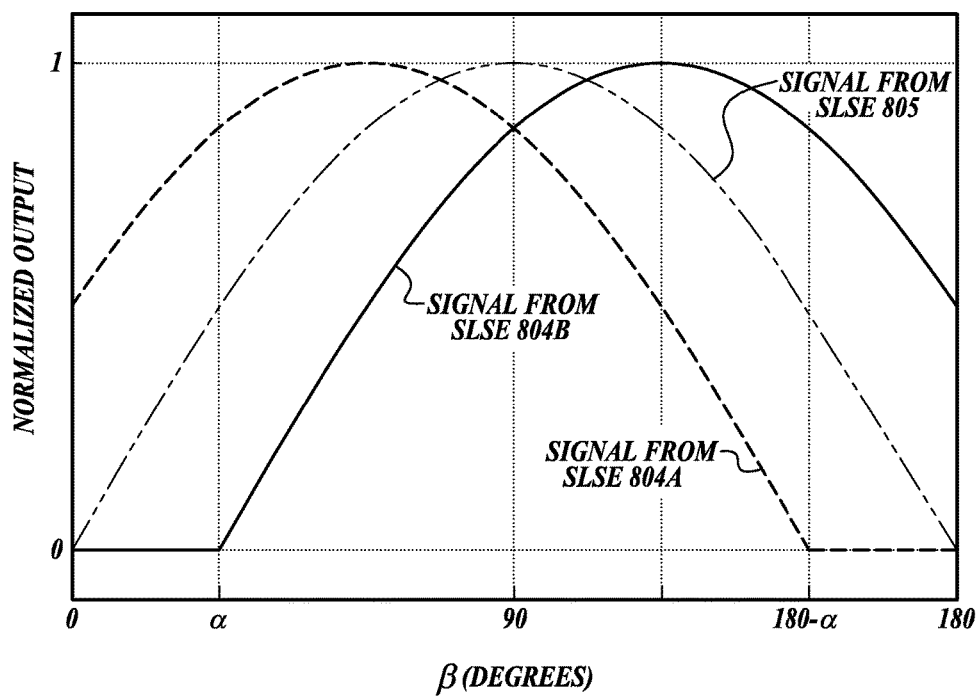
FIG. 9 depicts an example of a comparison of the light intensities as measured by two opposing light sensitive areas on the sides and the one on top surface of the VLS of FIG. 8.

FIG. 9 illustrates the normalized amount of light received by SLSEs 804A, 804C, and 805 as the light source moves parallel to the plane of VLS 801. By combining the signals from all three SLSEs, the VLS receives light from any angle on at least two of the SLSEs (i.e., SLSEs 804A and 805 if $0 < \beta < 180° - \alpha$ and SLSEs 804C and 805 if $180° - \alpha < \beta < 180°$). Therefore, the direction and intensity of the incident beam can be calculated from any angle above the VLS plane 801.

Finding the light beam direction in three-dimensional space follows a similar procedure. If a VLS with four sides is used to detect the direction of light from a source, each pair of opposing SLSEs (the pairs 804A&804B or 804C&804D) provides the coordinates for a plane instead of a line in a two dimensional space. The direction to source can be found from the intersection of the two planes. If SLSE 805 exists on the structure, the VLS can provide angular information from any source in the space.

Figure 10:
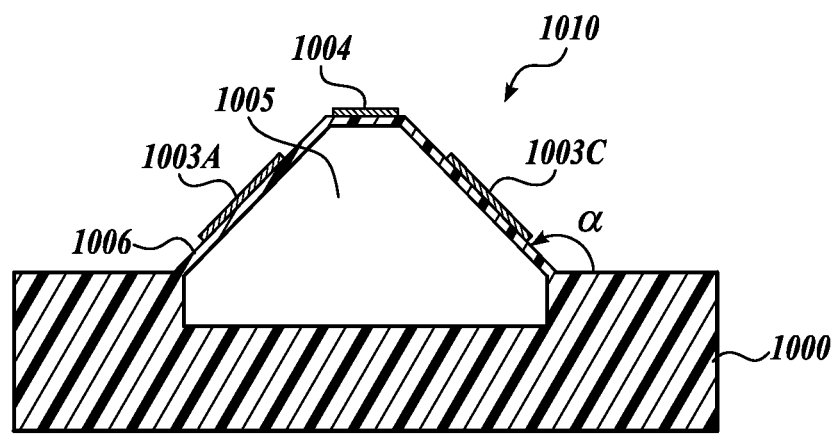
FIG. 10 illustrates a cross-sectional view of an embodiment of a VLS where a portion of the substrate below the sensitive areas is removed.

In some embodiments, a portion of the VLS structure underneath the sensing areas may be removed. This, for instance, may be required when the light wavelengths of interest are in the infrared range in order to reduce the loss of generated heat to the substrate. FIG. 10 illustrates an example of such an embodiment. The substrate 1000 is used to give the VLS its three-dimensional shape. The three-dimensional shape can be transferred to a thin film 1006 that is deposited or grown on top of the structure. SLSEs 1003A and 1003C and possibly 1004 are realized on this structure. Another SLSE may be realized on surface 1004. After fabrication of the SLSEs, the substrate immediately below the SLSEs 1005 is removed while the thin film holds the SLSEs in place.

Figure 11:
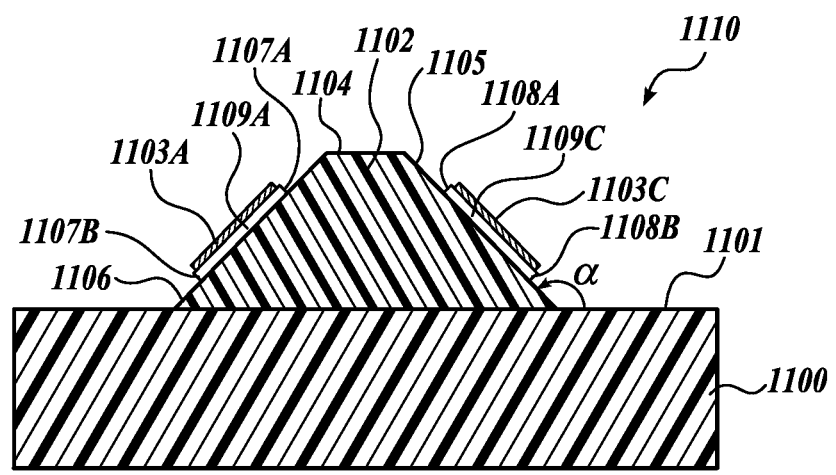
FIG. 11 illustrates the cross-sectional view of a VLS where there is a gap between the light-sensitive areas and the structure of the VLS.

Partial isolation of the SLSEs from the substrate is also possible through putting the SLSEs on an elevated platform. FIG. 11 demonstrates a possible structure where substrate 1100 is used to give the VLS its three-dimensional shape. The three-dimensional shape will be transferred the thin films that are deposited or grown on top of the structure. To realize an elevated structure, a sacrificial thin film with the desired thickness may be deposited or grown. The SLSEs 1103A and 1103C and their supporting films and contacts will be realized on top of this sacrificial film. Connections to the VLS structure and electrical contacts to the SLSEs (i.e., structures 1107A & 1107B and 1108A & 1108B) are also created to the VLS structure. The sacrificial layer can then be partially or entirely removed to create the necessary gap between the SLSEs and corresponding faces on the structure, 1105 and 1106. A similar procedure could be followed to place an elevated SLSE on surface 1104.

Figure 12A:
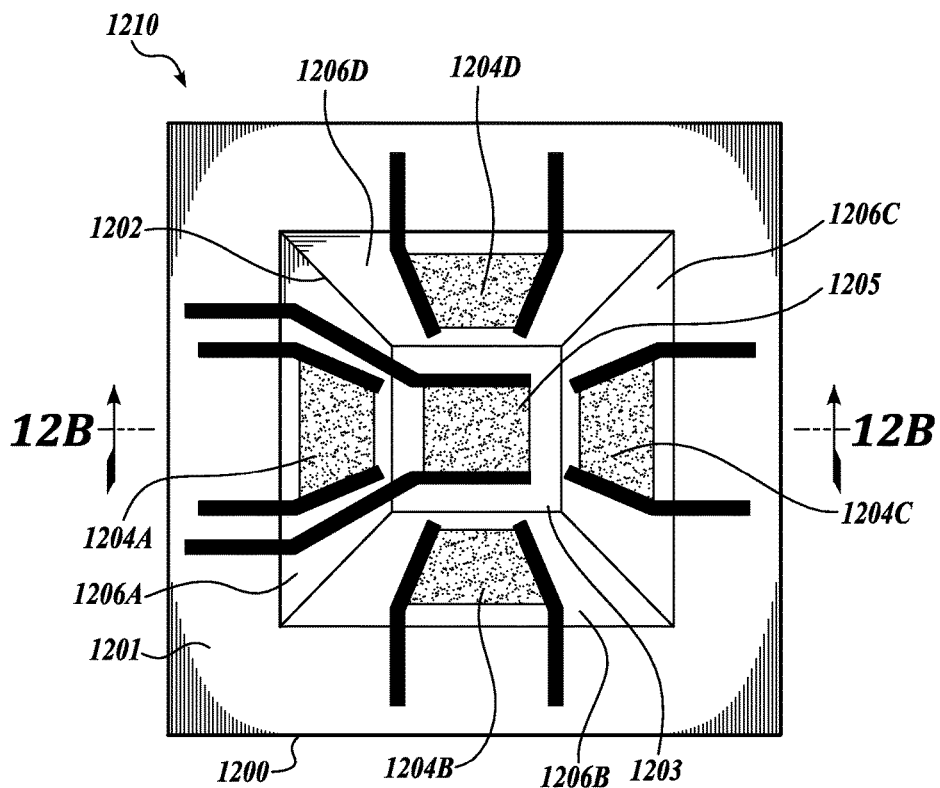
FIGS. 12A and 12B illustrate top and cross-sectional views, respectively, of an embodiment of a VLS realized in the shape of an inverted pyramid.
Figure 12B:
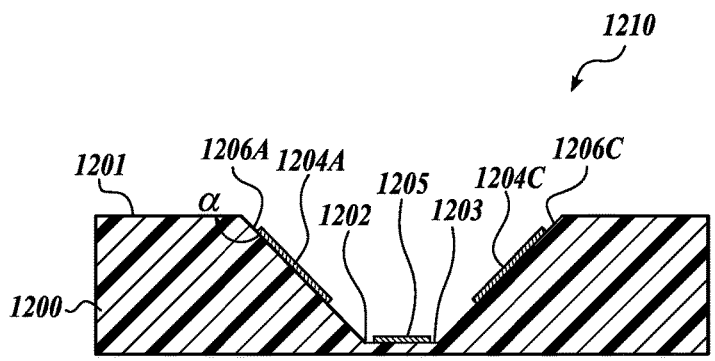

A VLS may be realized from an inverted pyramidal structure that is etched into the substrate, in contrast to being raised above it, as shown in FIGS. 12A and 12B. While manufacturing of such a VLS will be different, the basic principles of operation are similar to the VLS structures described earlier. In this case, the SLSEs 1204A to 1204D are realized on the inside walls 1206 of an inverted pyramid 1202. As with VLSs with the raised structure, SLSE 1205 at the bottom surface may be realized on the principle plane of the substrate 1201. Furthermore, the SLSEs may be realized from p-n or other light sensing methods. As with the basic VLS structure described in FIGS. 10 and 11, the substrate underneath the SLSEs may be removed or SLSEs may be elevated from the structure if needed.

Figure 13:
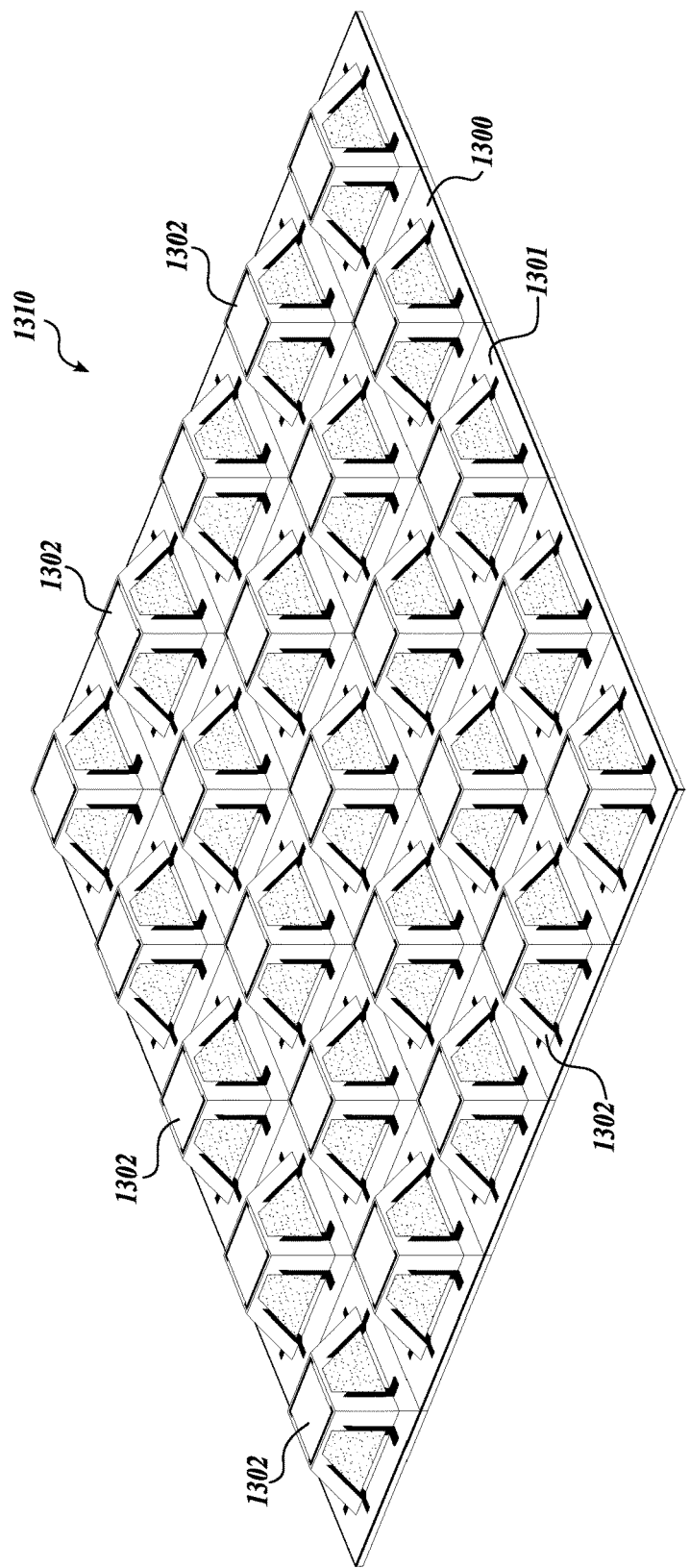
FIG. 13 shows an arrangement of VLSs in a two-dimensional array.
Figure 14:
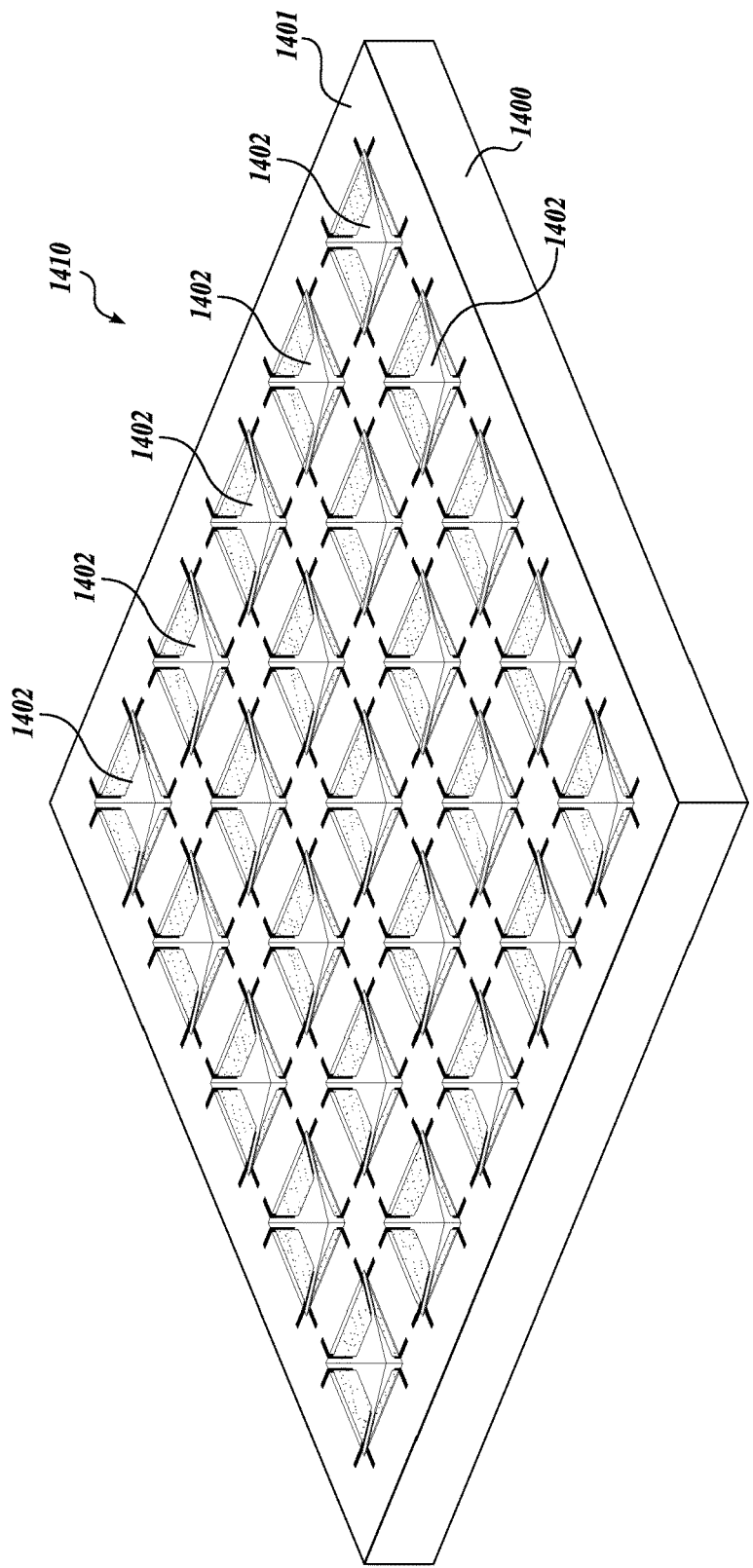
FIG. 14 shows an arrangement of VLSs based on inverted pyramids in a two-dimensional array.

It is possible to integrate multiple VLS side-by-side to produce an image sensor. A sample embodiment of such arrayed VLS (AVLS) structure is shown in FIG. 13 where several VLSs 1302 are fabricated on a substrate 1300 with a major surface 1301. FIG. 14 shows a 2D array of VLSs 1402 based on inverted pyramids which are fabricated on a substrate 1400 with a major surface 1401. A single image sensor with VLS pixels can provide information about the intensity as well as depth for the objects within its field of view. In contrast to the available technologies for 3D imaging, this technology requires one sensor and provides the location information in real-time.

It is possible to use weighted signals from the sides of the VLS in an AVLS so that the sensor effectively "looks at" a particular direction. In other words, the sensor can generate images from various directions simply by changing the weights assigned to different faces of the VLSs.

A VLS structure 202, 402, 702, or 1202 can be realized through anisotropic etching of a substrate. For example, it is possible to selectively etch the surface of a crystalline silicon wafer in alkaline solutions such as potassium hydroxide to realize such pyramids. The difference in etch rates of different silicon crystal planes in such anisotropic etchants results in creation of well-defined angles on etched structures. For instance, if the top surface of the wafer is a (100) plane of the silicon crystal (i.e., surface 201, 401, 701, or 1201), the pyramidal shape of the VLS can be realized with sides of the structure (surfaces 403A and 403B or 705A and 705B or 1206) being on (111) planes. In this case, a is determined by the angle between (100) and (111) planes in silicon, which is approximately 125.3°. The LSAs are fabricated and aligned with these surfaces, letting the SLSEs be oriented predictably and repeatably.

Obtaining square bases or tops may require the use of corner compensation geometries during the microfabrication processes in some cases. Without corner compensation, the shape of top or base of the pyramid may be polygons with more than four sides. However, this does not affect the operation principle of the VLS.

Arbitrary angles between LSAs and major surface of the substrate can be realized through three-dimensional lithography and etching techniques such as gray-scale lithography or dry anisotropic etching of tilted substrates. These techniques also allow for the microfabrication of VLSs from pyramids with arbitrary number of faces (3 or more sides). In practice, however, a symmetric flat-top VLS structure with four SLSEs on its sides and one SLSE on its top surface is the preferred shape in terms of fabrication and application.

While illustrative embodiments have been illustrated and described, it will be appreciated that various changes can be made therein without departing from the spirit and scope of the invention.

The embodiments of the invention in which an exclusive property or privilege is claimed are defined as follows:

1. A vector light sensor (VLS) comprising:
   a crystalline silicon substrate having a major surface in a (100) plane; and
   a sensor structure comprising:
   a pyramid structure integral with the silicon substrate, the pyramid structure protruding from the major surface of the crystalline silicon, the pyramid structure forming at least a portion of a body of the sensor structure, the pyramid structure having predefined angles between the major surface of the substrate and a plurality of sidewalls of the pyramid structure, wherein the pyramid structure is etched from the crystalline silicon substrate, and wherein the angles are predefined by anisotropic etching of the crystalline silicon substrate,
   individual light-sensitive areas formed on each of two or more of the plurality of sidewalls of the pyramid structure, and
   electrical contacts carried by the substrate and electrically coupled to the light-sensitive areas.

2. The VLS of claim 1, wherein at least two of the plurality of sidewalls meet at a point.

3. The VLS of claim 1, further comprising:
   a flat surface on top of the pyramid structure, wherein the flat surface is substantially parallel to the major surface of the substrate.

4. The VLS of claim 1, wherein the pyramid has a polygon base.

5. The VLS of claim 4, wherein the polygon base is a square base.

6. The VLS of claim 4, wherein the polygon base is a triangular base.

7. The VLS of claim 1, wherein the light-sensitive areas comprise photoconductive materials.

8. The VLS of claim 1, wherein the light-sensitive areas comprise pyroelectric materials.

9. The VLS of claim 1, wherein the light-sensitive areas comprise light-sensing layers based on nanoparticles.

10. The VLS of claim 1, wherein the light-sensitive areas comprise photodiodes.

11. The VLS of claim 1, wherein the light-sensitive areas comprise charge-coupled devices.

12. The VLS of claim 1, wherein the light-sensitive areas are sensitive to light wavelengths in the visible range.

13. The VLS of claim 1, wherein the light-sensitive areas are sensitive to light wavelengths in the infrared range.

14. The VLS of any claim 1, wherein the light-sensitive areas are sensitive to light wavelengths in the ultra-violet range.

15. The VLS of claim 1, wherein the light-sensitive areas are sensitive to light wavelengths in the X-ray range.

16. The VLS of claim 1, wherein the light-sensitive areas are sensitive to light wavelengths in the Gamma-ray range.

17. The VLS of claim 1, wherein at least one of the light-sensitive areas is located in a partially-removed portion of the substrate.

18. The VLS of claim 1, wherein one or more of the light-sensitive areas are located on an elevated platform.

19. The VLS of claim 1, further comprising:
   a signal processing interface coupled to the electrical contacts and configured to extract information about intensity and direction of an incident light beam by comparing signals from two or more of the light-sensitive areas.

20. The VLS of claim 1, where the light sensitive areas are silicon pn junctions made from the body of the pyramid structure.

21. The VLS of claim 1, wherein the pyramid structure is a member of a 2D array of pyramid structures, wherein individual pyramid structures of the 2D array of pyramid structures are integral-with and protrude-from the major surface of the crystalline silicon substrate, and wherein individual light-sensitive areas are formed on each of two or more of the plurality of sidewalls of the individual pyramid structures of the 2D array of pyramid structures.

22. A vector light sensor (VLS) array comprising:
   a crystalline silicon substrate having a major surface in a (100) plane;
   a plurality of sensor structures on the major surface of the substrate, wherein each of the plurality of sensor structures comprises:
   a pyramid structure integral with the silicon substrate, the pyramid structure protruding from the major surface of the substrate, the pyramid structure having predefined angles between the major surface of the substrate and a plurality of sidewalls of the pyramid, wherein the pyramid structure is formed from the crystalline silicon substrate, and wherein the angles are predefined by anisotropic etching of the crystalline silicon substrate,
   individual light-sensitive areas formed on each of two or more of the plurality of sidewalls of the pyramid structure, and
   electrical contacts carried by the substrate and electrically coupling the light-sensitive areas.

23. The VLS of claim 22, where the light sensitive areas are silicon pn junctions made from the body of the pyramid structure.

24. The VLS of claim 22, wherein the light-sensitive areas comprise photoconductive materials.

25. The VLS array of claim 22, wherein the pyramid structure is a member of a 2D array of pyramid structures, wherein individual pyramid structures of the 2D array of pyramid structures are integral-with and protrude-from the major surface of the crystalline silicon substrate, and wherein individual light-sensitive areas are formed on each of two or more of the plurality of sidewalls of the individual pyramid structures of the 2D array of pyramid structures.

26. A vector light sensor (VLS) comprising:
   a crystalline silicon substrate having a major surface in a (100) plane; and
   a sensor structure comprising:
   a pyramid structure integral with the silicon substrate, forming at least a portion of a body of the sensor structure, the pyramid structure having predefined angles between the major surface of the crystalline silicon substrate and a plurality of sidewalls of the pyramid structure, wherein the pyramid structure protrudes into the silicon substrate, and wherein the sidewalls of the pyramid structure form an inverted pyramid anisotropically etched into the crystalline silicon substrate,
   individual light-sensitive areas formed on each of two or more of the plurality of sidewalls of the pyramid structure, wherein the light-sensitive areas face each other, and wherein entire individual light-sensitive areas are smaller than or equal to the corresponding individual sidewalls of the pyramid structure, and
   electrical contacts carried by the substrate and electrically coupled to the light-sensitive areas.

27. The VLS of claim 26, wherein the pyramid structure is a member of a 2D array of pyramid structures, wherein individual pyramid structures of the 2D array of pyramid structures are integral-with and protrude-into the crystalline silicon substrate, and wherein individual light-sensitive areas are formed on each of two or more of the plurality of sidewalls of the individual pyramid structures of the 2D array of pyramid structures.

\* \* \* \* \*